(12) United States Patent
Yuan et al.

(10) Patent No.: US 9,437,481 B2
(45) Date of Patent: Sep. 6, 2016

(54) SELF-ALIGNED DOUBLE PATTERNING PROCESS FOR TWO DIMENSIONAL PATTERNS

(71) Applicant: GLOBALFOUNDRIES Inc., Grand Cayman (KY)

(72) Inventors: Lei Yuan, Cupertino, CA (US); Jia Zeng, Sunnyvale, CA (US); Youngtag Woo, San Ramon, CA (US); Jongwook Kye, Pleasanton, CA (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 0 days.

(21) Appl. No.: 14/674,792

(22) Filed: Mar. 31, 2015

(65) Prior Publication Data

US 2016/0163584 A1 Jun. 9, 2016

Related U.S. Application Data

(60) Provisional application No. 62/088,150, filed on Dec. 5, 2014.

(51) Int. Cl.
| | |
|---|---|
| *H01L 21/4763* | (2006.01) |
| *H01L 21/768* | (2006.01) |
| *H01L 21/3213* | (2006.01) |
| *H01L 21/311* | (2006.01) |
| *H01L 21/033* | (2006.01) |
| *H01L 21/027* | (2006.01) |

(52) U.S. Cl.
CPC ... *H01L 21/76802* (2013.01); *H01L 21/76877* (2013.01); *H01L 21/027* (2013.01); *H01L 21/033* (2013.01); *H01L 21/31144* (2013.01); *H01L 21/32139* (2013.01)

(58) Field of Classification Search
CPC .............. H01L 21/76802; H01L 21/76877; H01L 21/027; H01L 21/033; H01L 21/31144; H01L 21/32139; H01L 21/0337; H01L 21/0332; H01L 21/0268; H01L 21/02642
USPC ........................................................ 438/618
See application file for complete search history.

(56) References Cited

U.S. PATENT DOCUMENTS

| | | | |
|---|---|---|---|
| 7,856,613 B1 * | 12/2010 | Weling ...................... | G03F 1/14 378/35 |
| 8,298,943 B1 * | 10/2012 | Arnold ................ | H01L 21/0337 438/667 |

* cited by examiner

*Primary Examiner* — Xinning Niu
*Assistant Examiner* — Vu A Vu
(74) *Attorney, Agent, or Firm* — Amerson Law Firm, PLLC

(57) ABSTRACT

One method includes forming a mandrel element above a hard mask layer, forming first and second spacers on the mandrel element, removing the mandrel element, a first opening being defined between the first and second spacers and exposing a portion of the hard mask layer and having a longitudinal axis extending in a first direction, forming a block mask covering a middle portion of the first opening, the block mask having a longitudinal axis extending in a second direction different than the first direction, etching the hard mask layer in the presence of the block mask and the first and second spacers to define aligned first and second line segment openings in the hard mask layer extending in the first direction, etching recesses in a dielectric layer disposed beneath the hard mask layer based on the first and second line segment openings, and filling the recesses with a conductive material.

20 Claims, 7 Drawing Sheets

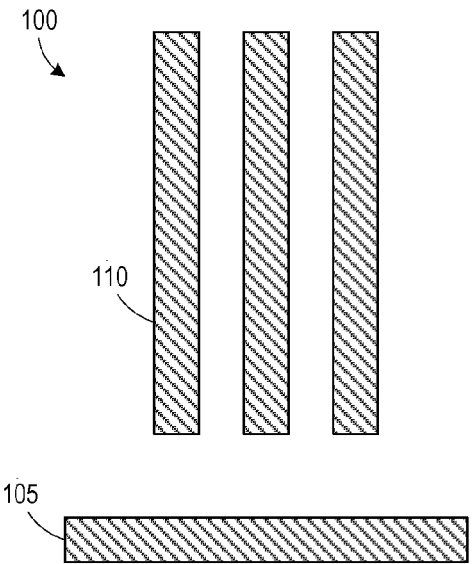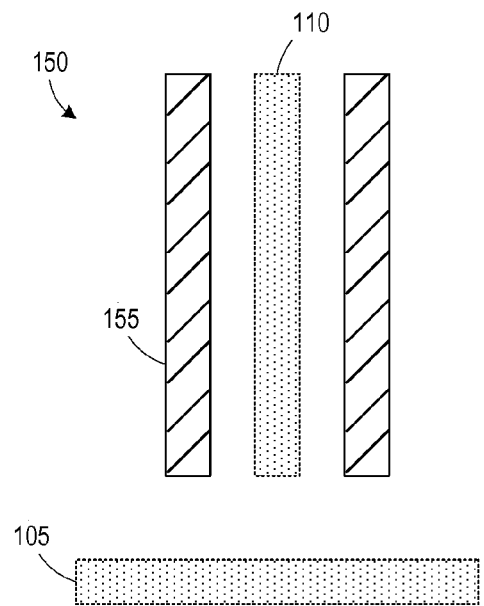
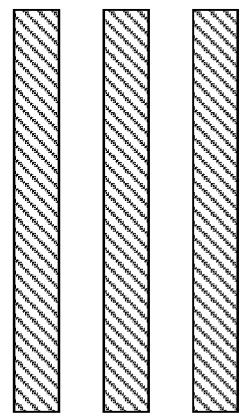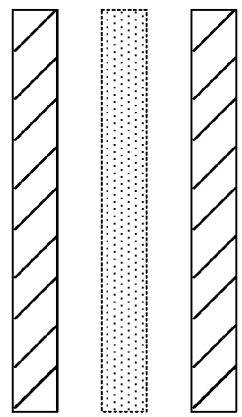
Fig. 1A
(Prior Art)
Fig. 1B
(Prior Art)

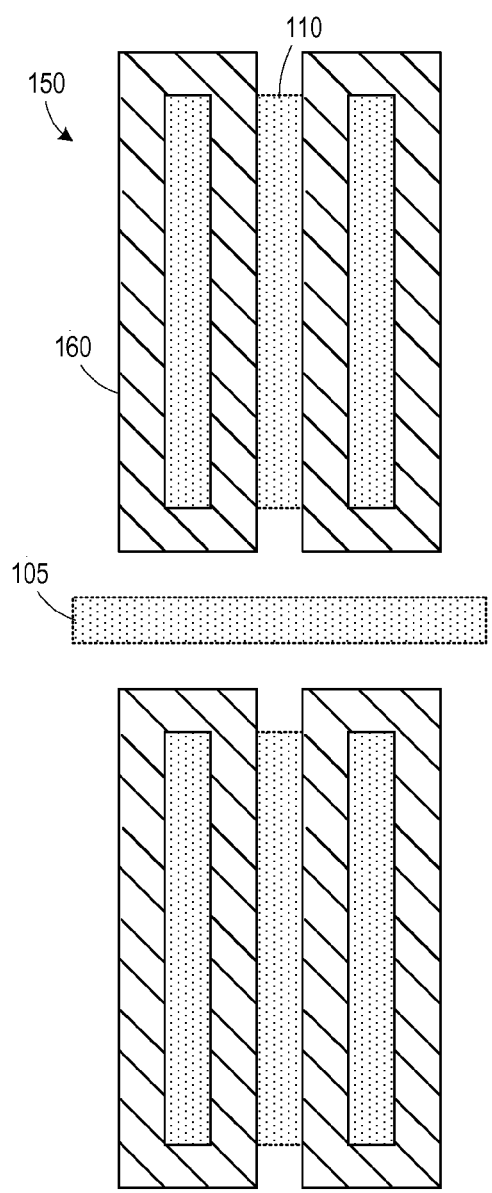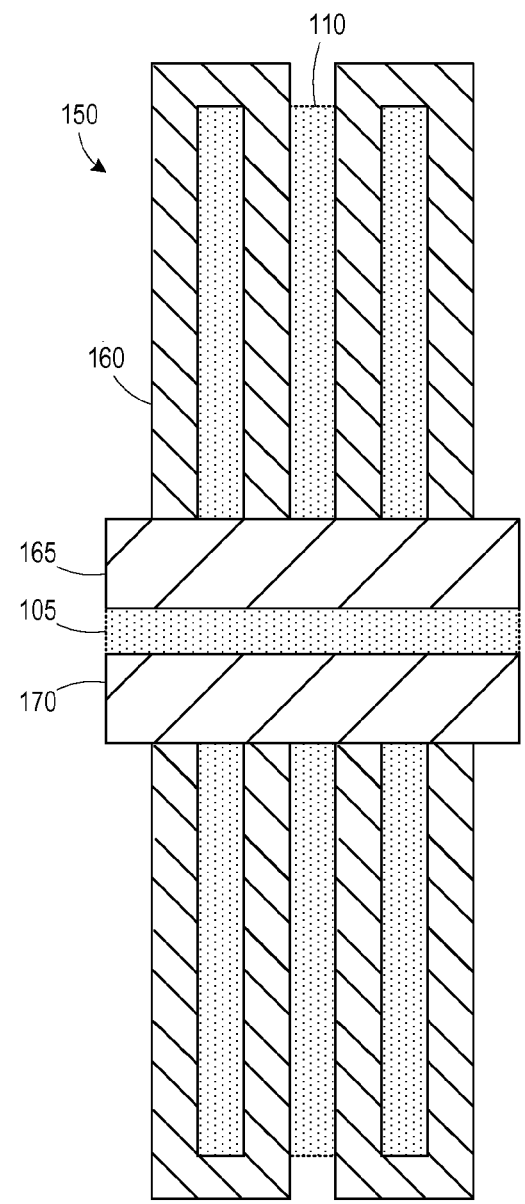
Fig. 1C
(Prior Art)
Fig. 1D
(Prior Art)

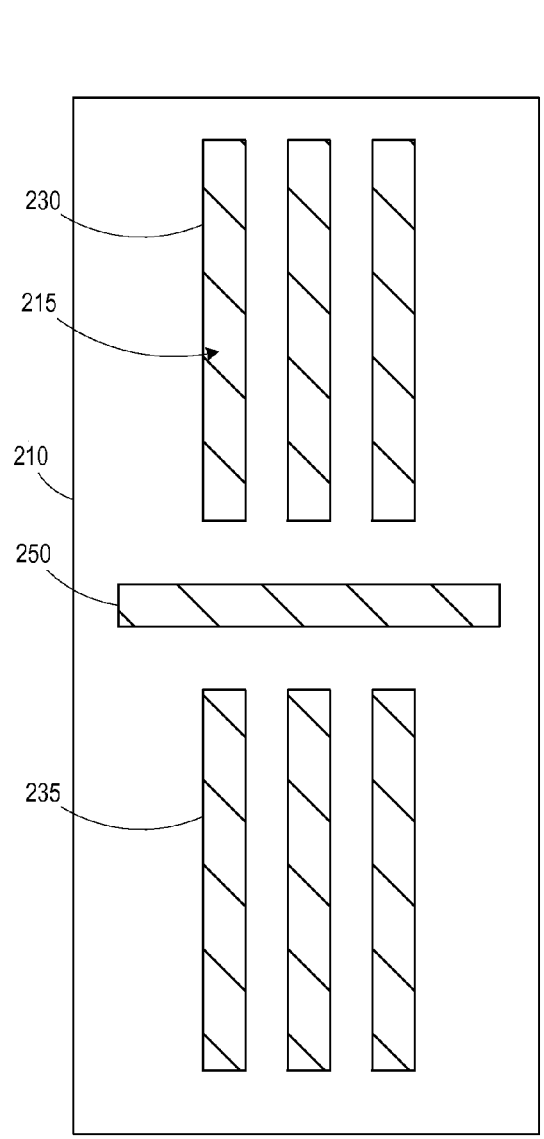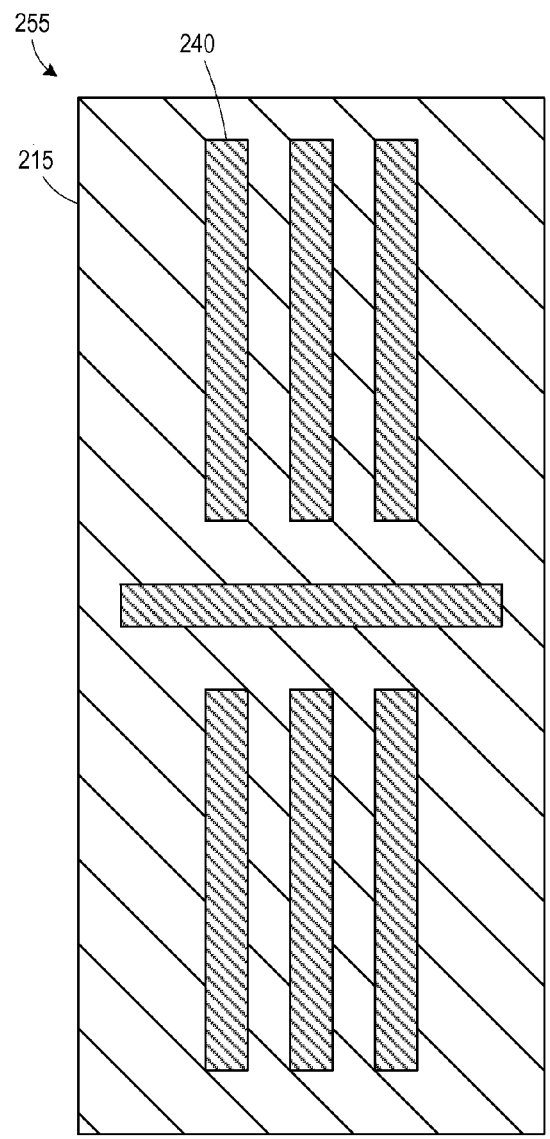
Fig. 2G  Fig. 2H

SELF-ALIGNED DOUBLE PATTERNING PROCESS FOR TWO DIMENSIONAL PATTERNS

BACKGROUND OF THE INVENTION

1. Field of the Invention

Generally, the present disclosure relates to the manufacture of semiconductor devices, and, more specifically, to a self-aligned double patterning process for two dimensional patterns.

2. Description of the Related Art

Photolithography is one of the basic processes used in manufacturing integrated circuit products. At a very high level, photolithography involves: (1) forming a layer of light or radiation-sensitive material, such as photoresist, above a layer of material or a substrate; (2) selectively exposing the radiation-sensitive material to a light generated by a light source (such as a DUV or EUV source) to transfer a pattern defined by a mask or reticle (interchangeable terms as used herein) to the radiation-sensitive material; and (3) developing the exposed layer of radiation-sensitive material to define a patterned mask layer. Various process operations, such as etching or ion implantation processes, may then be performed on the underlying layer of material or substrate through the patterned mask layer.

Of course, the ultimate goal in integrated circuit fabrication is to faithfully reproduce the original circuit design on the integrated circuit product. Historically, the feature sizes and pitches employed in integrated circuit products were such that a desired pattern could be formed using a single patterned photoresist masking layer. However, in recent years, device dimensions and pitches have been reduced to the point where existing photolithography tools, e.g., 193 nm wavelength immersion photolithography tools, cannot form a single patterned mask layer with all of the features of the overall target pattern. Accordingly, device designers have resorted to techniques that involve performing multiple exposures to define a single target pattern in a layer of material. One such technique is generally referred to as multiple patterning, e.g., double patterning. In general, double patterning is an exposure method that involves splitting (i.e., dividing or separating) a dense overall target circuit pattern into two separate, less-dense patterns. The simplified, less-dense patterns are then printed separately on a wafer utilizing two separate masks (where one of the masks is utilized to image one of the less-dense patterns, and the other mask is utilized to image the other less-dense pattern). Further, in some cases, the second pattern is printed in between the lines of the first pattern such that the imaged wafer has, for example, a feature pitch which is half that found on either of the two less-dense masks. This technique effectively lowers the complexity of the photolithography process, improving the achievable resolution and enabling the printing of far smaller features that would otherwise be impossible using existing photolithography tools. The self-aligned double patterning (SADP) process is one such multiple patterning technique. The SADP process may be an attractive solution for manufacturing next-generation devices, particularly metal routing lines on such next-generation devices, due to better overlay control that is possible when using an SADP process.

FIG. 1A illustrates a design layout for an exemplary interconnect structure 100. The interconnect structure 100 includes conductive elements, such as metal lines, embedded in a dielectric layer. The illustrated interconnect structure 100 is useful for implementing logic standard cells, which interconnect transistors (e.g., CMOS devices) to provide a Boolean logic function (e.g., AND, OR, XOR, XNOR, inverters) or a storage function (flip-flop or latch). The interconnect structure 100 includes a horizontal conductive line 105, which may be used as a power rail in a standard logic cell array, and a series of vertical conductive lines 110, which may be used for inter-cell connections to define the logic elements. A gate layer (e.g., polysilicon) (not shown) may be formed beneath the interconnect structure 100 to define the actual logic operations for the cells.

To form the ultra-regular, dense interconnect structure 100 of FIG. 1A, which is preferred for 10 nm technology or smaller due to the complexity of manufacturing conventionally 2D (two dimensional) interconnect patterns, an SADP process is conventionally used to minimize the alignment error between two adjacent lines. FIG. 1B illustrates one illustrative SADP template 150 for forming the interconnect structure 100. The polygons with dotted shading and dashed lines reflect the desired pattern of the interconnect structure 100. The template includes mandrel elements 155. FIG. 1C illustrates the SADP template 150 after a spacer layer (not shown) was formed above the mandrel elements 155, the spacer layer was etched to define spacers 160 adjacent the mandrel elements 155, and the mandrel elements 155 were removed. The spacers 160 define an etch mask for the vertical lines 110. FIG. 1D illustrates the SADP template 150 after block masks 165, 170 (e.g., photoresist) are formed to define the pattern for the horizontal line 105. The template 150 illustrated in FIG. 1D may be used to etch an underlying hard mask layer, and, subsequently, a dielectric layer beneath the hard mask layer may be etched to define trench recesses. The trench recesses may be filled with metal to complete the interconnect structure 100 illustrated in FIG. 1B.

The patterning process illustrated in FIGS. 1A-1D has several limitations. FIG. 1E illustrates the template 150 showing the mandrel elements 155 and the block masks 165, 170 to illustrate these limitations. The mandrel elements 155 define a 2D pattern due to the line ends, i.e., a pattern that does not exhibit spacing constraints in just one direction. The tip-to-tip spacing 175 between the mandrel elements 155 is limited by the photolithography process. For example, assuming a minimum dimension of the block masks 165, 170 being 40 nm and a minimum space between the block masks 165, 170 being 40 nm, the minimum tip-to-tip spacing 175 is 120 nm. Also, when printing the mandrel elements 155, non-ideal printing that occurs in a normal photolithography process results in corner rounding (not shown) and pull-back (not shown) in the line ends, further increasing the tip-to-tip spacing 175 and increasing the difficulties associated with forming vias (not shown) above the interconnect structure 100 to contact the lines 110.

FIG. 1F illustrates another approach to forming the interconnect structure 100 by employing a triple patterning process. For each patterning step, there are photolithography and etching steps. A first set of vertical lines 110A is formed with a first patterning step, a second set of vertical lines 110B (i.e., interleaved with respect to the first set) is formed with a second patterning step, and the horizontal line 105C is formed with a third patterning step. The sets of vertical lines 110A, 110B are interleaved to address minimum spacing constraints. This approach suffers from line-to-line misalignment issues and poor line end printability due to pull-back and corner rounding.

The present disclosure is directed to various methods for forming 2D patterns using a 1D self-aligned double patterning process to manufacture integrated circuit products which may solve or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to designate the scope of the invention. Its sole purpose is to present some concepts in a simplified form as a prelude to the more detailed description that is discussed later.

Generally, the present disclosure is directed to various methods that involve using a 1D self-aligned double patterning process to manufacture integrated circuit products. One illustrative method disclosed herein involves, among other things, forming a patterning template including a plurality of lines above a hard mask layer. A portion of the hard mask layer is exposed between adjacent lines. A block mask covering a middle portion of the plurality of lines is formed. The hard mask layer is etched in the presence of the block mask and the patterning template to define aligned first and second line segment openings in the hard mask layer. The block mask and the patterning template are removed. A cut mask is formed above the hard mask layer. The cut mask is patterned to define an opening disposed between the first and second line segment openings and exposing the hard mask layer. The hard mask layer is etched in the presence of the cut mask to define a line opening between the first and second line segment openings. Recesses are etched in a dielectric layer disposed beneath the hard mask layer based on the first and second line segment openings and the line opening. The recesses are filled with a conductive material.

Another illustrative method includes, among other things, forming a mandrel element above a hard mask layer and forming first and second spacers on sidewalls of the mandrel element, and forming a patterning template defining a first opening to expose a hard mask layer. The mandrel element is removed. A first opening is defined between the first and second spacers. The first opening exposes a portion of the hard mask layer and has a first longitudinal axis extending in a first direction. A block mask covering a middle portion of the first opening is formed. The block mask has a second longitudinal axis extending in a second direction different than the first direction. The hard mask layer is etched in the presence of the block mask and the first and second spacers to define aligned first and second line segment openings in the hard mask layer extending in the first direction. The block mask and the first and second spacers are removed. Recesses are etched in a dielectric layer disposed beneath the hard mask layer based on the first and second line segment openings. The recesses are filled with a conductive material.

BRIEF DESCRIPTION OF THE DRAWINGS

The disclosure may be understood by reference to the following description taken in conjunction with the accompanying drawings, in which like reference numerals identify like elements, and in which:

FIGS. 1A-1F depict illustrative prior art processes for forming an interconnect structure; and FIGS. 2A-2H depict various methods disclosed herein of forming an interconnect structure using 1D self-aligned double patterning processes.

Figures 1E, 1F:
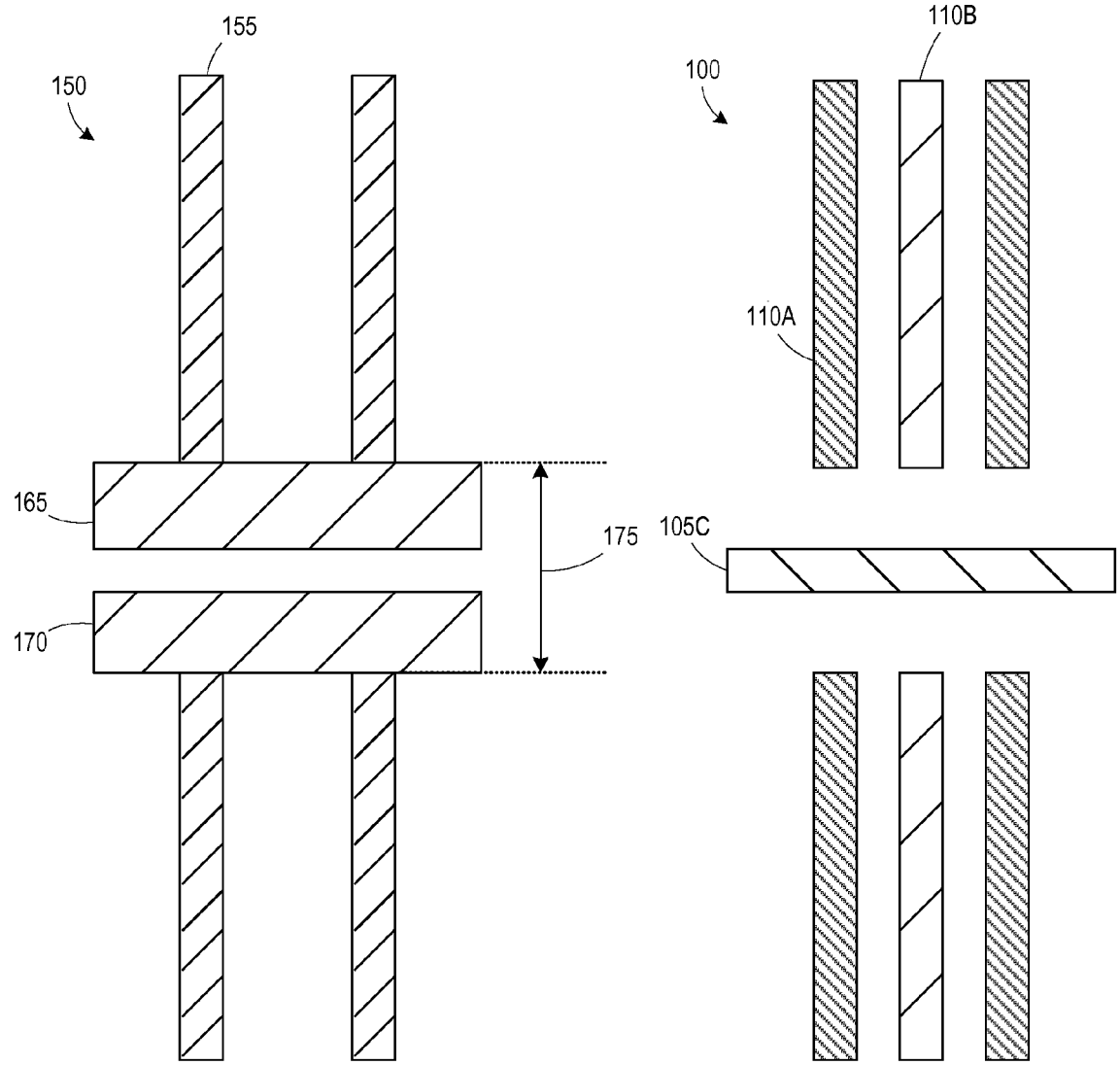

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods that involve a 1D self-aligned double patterning process to manufacture integrated circuit products. As will be readily apparent to those skilled in the art upon a complete reading of the present application, the methods and devices disclosed herein may be employed in the design and fabrication of a variety of devices, such as logic devices, memory devices, ASICs, etc. With reference to the attached figures, various illustrative embodiments of the methods and systems disclosed herein will now be described in more detail.

Figure 2A:
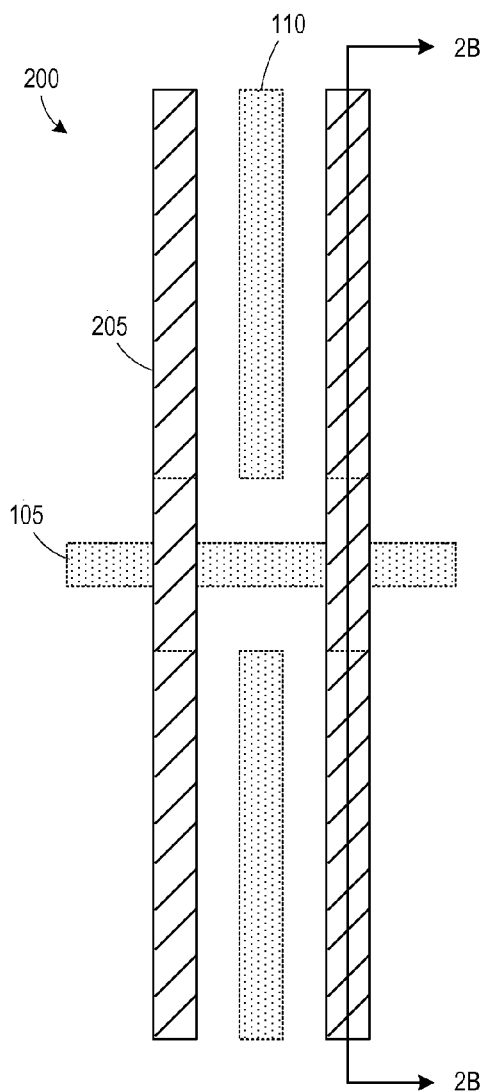

FIGS. 2A-2H depict various methods disclosed herein of forming an interconnect structure using 1D self-aligned double patterning processes. FIG. 2A illustrates a patterning template 200 including mandrel elements 205 (e.g., amorphous silicon). For illustrative purposes, the desired pattern (interconnect structure 100 illustrated in FIG. 1A with the horizontal line 105 and the vertical lines 110) is shown using polygons with dashed lines and dotted fill. Because the mandrel elements 205 extend the full length of the pattern, thus only exhibiting spacing constraints in one direction, they are considered 1D (one dimensional) patterns. That is, for 1D patterns, such as the mandrel elements 205, there are no tip-to-tip regions where spacing is limited by photolithography constraints or where tip pull-back can occur.

Figure 2B:
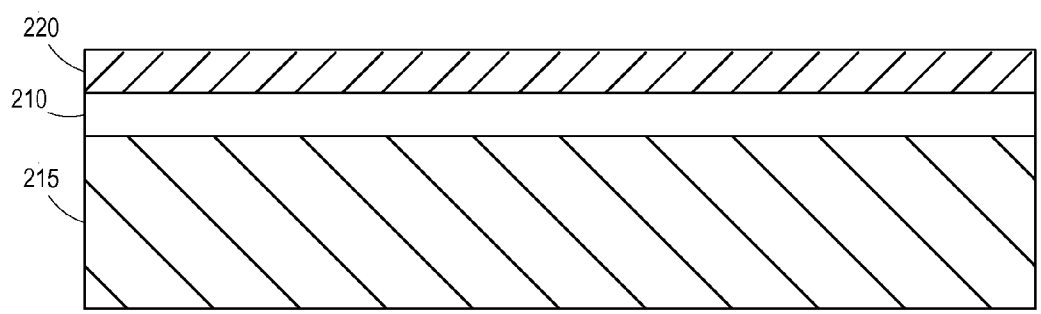

FIG. 2B illustrates a cross-section view of the patterning template 200 of FIG. 2A. A hard mask layer 210 (silicon nitride, spin on carbon, etc.) is formed above a dielectric layer 215 (e.g., a low-k dielectric material, a dielectric material having a dielectric constant of approximately 2.7 or higher or an ultra-low-k (ULK) material, a dielectric material having a dielectric constant of approximately 2.5 or lower). The patterning template 200 including the mandrel elements 205 is formed above the hard mask layer 210. Other layers may be formed below the patterning template 200, such as an anti-reflective coating (ARC) layer (not shown).

Figure 2C:
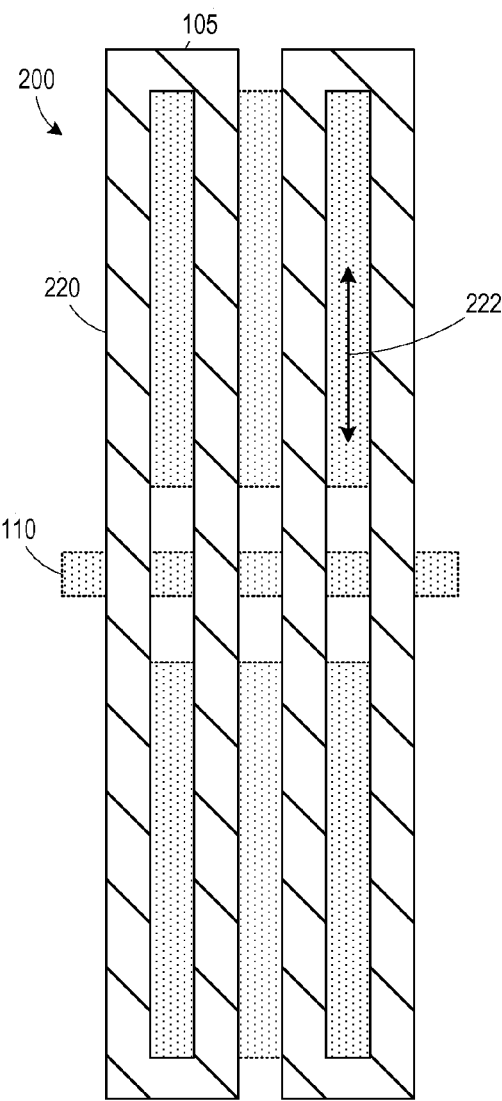

FIG. 2C illustrates the patterning template 200 after performing a deposition process to form a spacer layer (e.g., silicon dioxide) above the mandrel elements 205, performing an anisotropic etch process to define spacers 220 on sidewalls of the mandrel elements 205, and performing an etch process to remove the mandrel elements 205 selectively to the spacers 220 and the hard mask layer 210. The spacers 220 define openings exposing the hard mask layer 210 (shown in FIG. 2B, but not shown in FIG. 2C, as it lies beneath the patterning template 200) and having a longitudinal axis 222 that extends vertically. The desired pattern of the interconnect structure 100 shown in FIG. 1A is superimposed on the patterning template to illustrate what elements are desired to be formed and what portions of the patterning template define the elements.

Figure 2D:
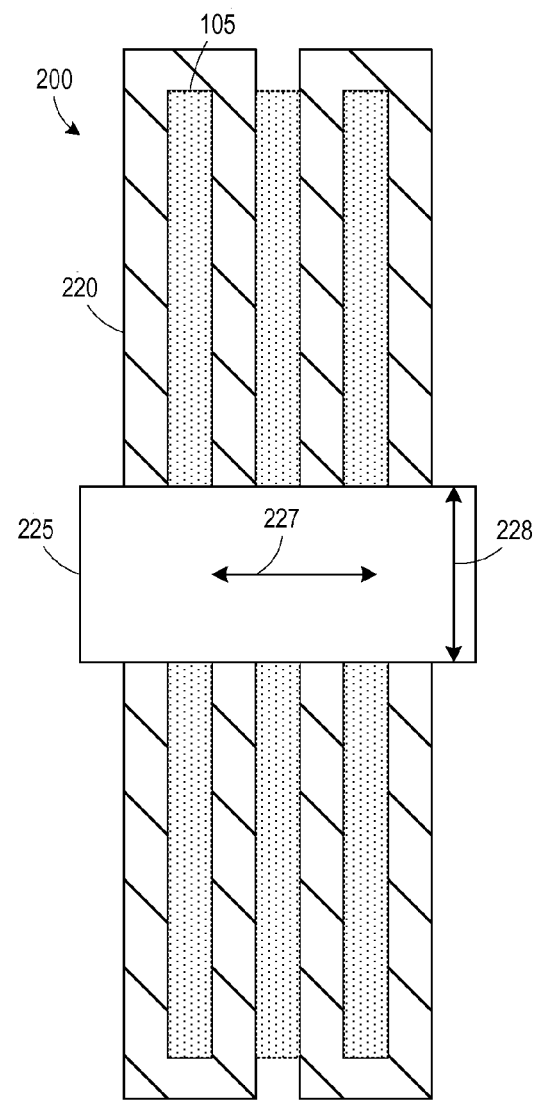

FIG. 2D illustrates the patterning template 200 after a block mask 225 (e.g., photoresist) is formed above the patterning template 200 and patterned as shown. The block mask 225 has a longitudinal axis 227 that runs horizontally and a width axis 228 which runs vertically. The width of the block mask 225 in the direction of the width axis 228 defines the tip-to-tip spacing between what will become the vertical lines 105 in the interconnect structure 100. The use of the block mask 225 prevents tip pull-back or corner rounding in the vertical lines 105. Because the tip-to-tip spacing is controlled only by the width of the block mask 225, a much smaller tip-to-tip spacing (e.g., 40 nm) is achievable as compared to the SADP process described in reference to FIGS. 1A-1E (e.g., 120 nm). The illustrative vertical lines 105 illustrate portions of the hard mask layer 210 exposed by the patterning template 200.

Figure 2E:
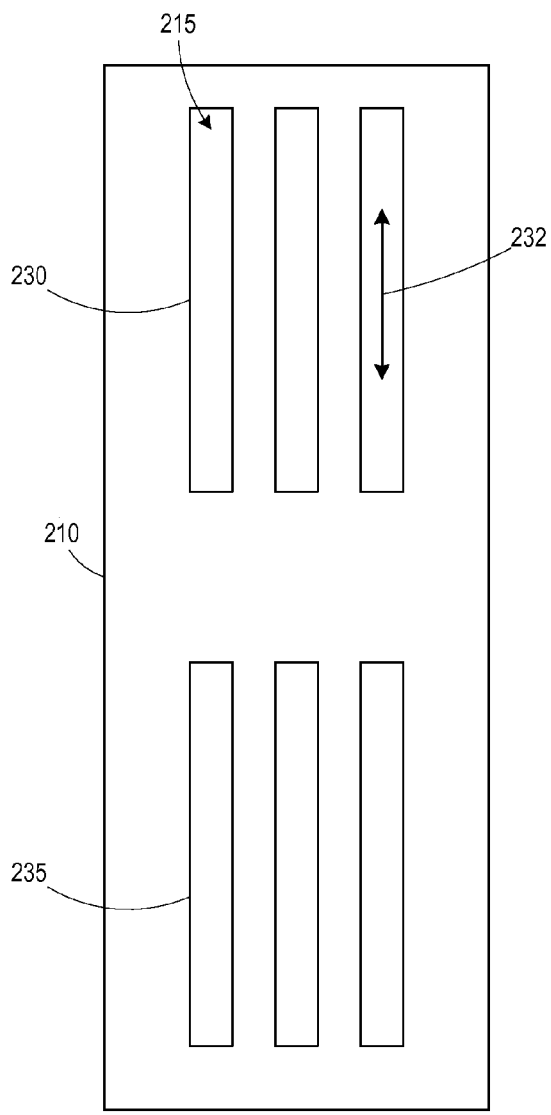

FIG. 2E illustrates the patterning template 200 after performing an anisotropic etch process in the presence of the spacers 220 and the block mask 225 (e.g., photoresist) to partially pattern the hard mask layer 210, performing an ashing process to remove the block mask 225, and performing an etch process to remove the spacers 220 selectively to the hard mask layer 210. This operation results in the formation of a partially patterned hard mask layer 210 comprised of vertically aligned line segment openings 230, 235 that expose corresponding underlying portions of the dielectric layer 215 beneath the partially patterned hard mask layer 210. The openings 230, 235 correspond to the locations where the vertical lines 110 will be formed in the dielectric layer 215 beneath the hard mask 210. The tip-to-tip spacing between aligned line segment openings 230, 235 in the partially patterned hard mask layer 210 is defined by the dimensions of the block mask 225. The line segment openings 230, 235 have a vertical longitudinal axis 232.

Figure 2F:
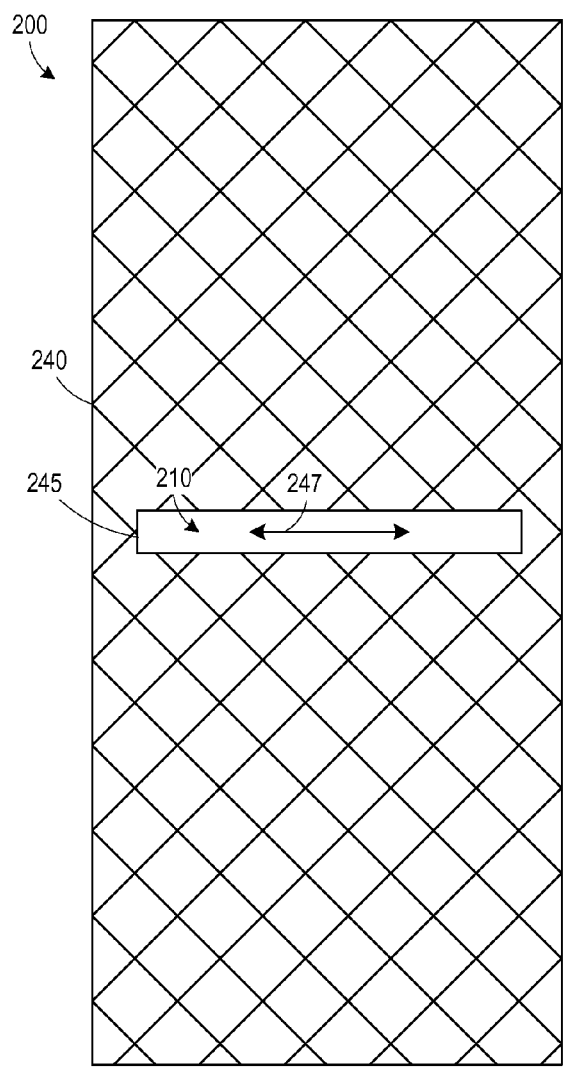

FIG. 2F illustrates the patterning template 200 after forming a cut mask 240 (e.g., photoresist—not shown) above the partially patterned hard mask layer 210. The cut mask 240 covers the previously formed openings 230, 235 in the partially patterned hard mask layer 210 and contains an opening 245 that exposes the hard mask layer 210 in a location corresponding to where the horizontal line 105 will be formed in the dielectric layer 215 beneath the hard mask layer 210. The opening 245 has a horizontal longitudinal axis 247.

FIG. 2G illustrates a fully patterned hard mask layer 210 after an etching process was performed through the cut mask 240 to define an opening 250 therein corresponding to the horizontal line 105 in the interconnect structure 100 and after removal of the cut mask 240. The fully patterned hard mask layer 210 includes the line segment openings 230, 235 and the horizontal line opening 250 formed therein. If desired, the process of forming the various openings 230, 235, 250 in the fully patterned hard mask layer 210 may be reversed, i.e., the opening 250 may be formed prior to the formation of the openings 230, 235. FIG. 2G illustrates the fully patterned hard mask layer 210 in position above the dielectric layer 215. Note that the line segment openings 230, 235 and the line opening 250 in the fully patterned hard mask layer 210 expose corresponding portions of the dielectric layer 215.

FIG. 2H depicts an interconnect structure 255 after several process operations were performed. First, an anisotropic etch process was performed through the openings 230, 235, 250 in the fully patterned hard mask layer 210 to etch the dielectric layer 215 to define corresponding recesses therein. Next, one or more deposition processes were performed so as to over-fill the recesses with a conductive material 240. Then, a planarization process was performed to remove excess conductive material 240 and the fully patterned hard mask layer 210. In some applications, the fully patterned hard mask layer 210 may remain in position after the excess conductive materials are removed. The conductive material 240 may include multiple layers, such as one or more barrier layers (e.g., Ta, TaN, TiN, etc.) to prevent migration of the metal in the interconnect structure 255 into the dielectric layer 215, a metal seed layer (e.g., copper), and a metal fill material (e.g., copper).

The use of the techniques described herein allows the interconnect structure 255 with 2D elements to be formed using a series of 1D patterning steps, thereby avoiding issues with spacing constraints, corner rounding and pull-back. The tip-to-tip spacing between vertical lines in the interconnect structure 255 may be smaller than may be achieved using a 2D patterning process. As a result, the technique allows better scaling as pattern sizes decrease.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a patterning template including a plurality of lines above a hard mask layer, wherein a portion of said hard mask layer is exposed between adjacent lines;
   forming a block mask covering a middle portion of said plurality of lines;
   etching said hard mask layer in the presence of said block mask and said patterning template to define aligned first and second line segment openings in said hard mask layer;
   removing said block mask and said patterning template;
   forming a cut mask above said hard mask layer after removing said block mask and said patterning template, said cut mask being patterned to define an opening disposed between said first and second line segment openings and exposing said hard mask layer;
   etching said hard mask layer in the presence of said cut mask to define a line opening in said hard mask layer between said first and second line segment openings;
   etching recesses in a dielectric layer disposed beneath said hard mask layer based on said first and second line segment openings and said line opening; and
   filling said recesses with a conductive material.

2. The method of claim 1, wherein forming said patterning template comprises:
   forming a mandrel element above said hard mask layer;
   forming spacers on sidewalls of said mandrel element; and
   removing said mandrel element, said spacers defining said plurality of lines.

3. The method of claim 1, wherein said line opening is perpendicular to said first and second line segment openings.

4. The method of claim 1, wherein said patterning template exposes a plurality of portions of said hard mask layer between sets of adjacent lines and etching said hard mask layer comprises etching said hard mask layer in the presence of said block mask to define sets of aligned first and second line segment openings in said hard mask layer.

5. The method of claim 4, wherein said line opening is disposed between said first and second line segment openings in each set.

6. The method of claim 1, wherein said block mask comprises a first photoresist mask.

7. The method of claim 6, wherein said cut mask comprises a second photoresist mask.

8. The method of claim 1, wherein said etching of said hard mask layer in the presence of said block mask occurs prior to said etching of said hard mask layer in the presence of said cut mask.

9. The method of claim 1, wherein said first and second line segment openings have a first longitudinal axis in a first direction and said line opening has a second longitudinal direction substantially perpendicular to said first direction.

10. The method of claim 1, wherein a tip-to-tip spacing of said first and second line segment openings is defined by a width of said block mask.

11. A method, comprising:
    forming a hard mask layer above a dielectric layer;
    forming a mandrel element above said hard mask layer;
    forming first and second spacers on sidewalls of said mandrel element;
    removing said mandrel element, a first opening being defined between said first and second spacers, said first opening exposing a portion of said hard mask layer and having a first longitudinal axis extending in a first direction;
    forming a block mask covering a middle portion of said first opening, said block mask having a second longitudinal axis extending in a second direction different than said first direction;
    etching said hard mask layer in the presence of said block mask and said first and second spacers to define aligned first and second line segment openings in said hard mask layer extending in said first direction and exposing portions of said dielectric layer;
    removing said block mask and said first and second spacers;
    etching recesses in said exposed portions of said dielectric layer through said first and second line segment openings in said hard mask layer; and
    filling said recesses with a conductive material.

12. The method of claim 11, further comprising:
    forming a cut mask above said hard mask layer after removing said block mask and said patterning template, said cut mask being patterned to define an opening having a longitudinal axis in said second direction, said opening being disposed between said first and second line segment openings and exposing said hard mask layer; and
    etching said hard mask layer in the presence of said cut mask to define a line opening disposed between said first and second line segment openings prior to etching said recesses.

13. The method of claim 12, wherein said block mask comprises a first photoresist mask and said cut mask comprises a second photoresist mask.

14. The method of claim 12, wherein said etching of said hard mask layer in the presence of said block mask occurs prior to said etching of said hard mask layer in the presence of said cut mask.

15. The method of claim 12, wherein said line opening is perpendicular to said first and second line segment openings.

16. The method of claim 11, wherein a tip-to-tip spacing of said first and second line segment openings is defined by a width of said block mask.

17. The method of claim 11, wherein said first opening comprises one of a plurality of openings in a patterning template exposing said hard mask layer, and etching said hard mask layer comprises etching said hard mask layer in the presence of said block mask to define sets of aligned first and second line segment openings in said hard mask layer.

18. The method of claim 17, wherein said line opening is disposed between said first and second line segment openings in each set.

19. The method of claim 11, wherein said mandrel element comprises a one dimensional pattern.

20. The method of claim 19, wherein said block mask and said cut mask comprise one dimensional patterns.

* * * * *